(12) United States Patent
Kocaman et al.

(10) Patent No.: US 6,748,027 B1
(45) Date of Patent: Jun. 8, 2004

(54) CMI SIGNAL TIMING RECOVERY

(75) Inventors: Namik K. Kocaman, Rancho Cordova, CA (US); Michael W. Altmann, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 658 days.

(21) Appl. No.: 09/637,323

(22) Filed: Aug. 10, 2000

(51) Int. Cl.7 .................................................. H04D 3/24
(52) U.S. Cl. ........................................ 375/316; 375/373
(58) Field of Search ................................ 375/316, 354, 375/371, 373, 374–375, 376, 286, 292–294

(56) References Cited

U.S. PATENT DOCUMENTS

| | | |
|---|---|---|
| 4,535,459 A | 8/1985 | Hogge, Jr. |
| 5,195,110 A * | 3/1993 | Gorshe ........................ 375/355 |
| 5,376,848 A * | 12/1994 | Hanke, III et al. ......... 327/141 |
| 5,631,587 A | 5/1997 | Co et al. |
| 5,949,264 A * | 9/1999 | Lo .............................. 327/157 |
| 6,040,742 A | 3/2000 | Bailey et al. |
| 6,278,332 B1 * | 8/2001 | Nelson et al. ................ 331/17 |

FOREIGN PATENT DOCUMENTS

| | | | |
|---|---|---|---|
| EP | 0499479 | * 8/1992 | .......... H04L/7/033 |
| WO | PCT/US 01/23718 | 2/2004 | |

* cited by examiner

*Primary Examiner*—Temesghen Ghebretinsae
*Assistant Examiner*—Kevin M Burd
(74) *Attorney, Agent, or Firm*—Blakely, Sokoloff, Taylor & Zafman LLP

(57) ABSTRACT

An apparatus and method for recovering a clock signal from a Coded Marked Inversion (CMI) encoded signal. A delay and divide circuit receives an incoming CMI encoded signal and produces a signal that has transitions corresponding to the bit boundaries of the CMI signal. This signal is then passed through a clock recovery loop (i.e., a phase-locked loop) to synchronize a clock signal with a CMI signal. The clock recovery loop further includes a delay circuit that adjusts the timing of the feedback signal such that it matches the delay of the CMI signal that occurs as the CMI signal passes through the delay and divide circuit. Accordingly, the circuit adjusts the timing of the recovered clock signal until it matches the clocking of the incoming CMI signal.

24 Claims, 6 Drawing Sheets

CM I SIGNAL TIMING RECOVERY

BACKGROUND OF THE INVENTION

1. Field of the Invention

The present invention generally concerns recovery of timing signals, and in particular concerns the recovery of a clock signal from an incoming stream of Coded Marked Inversion (CMI) data.

2. Background Information

In applications relating to the transmission of digital data, for example, across a communications cable, the format of the transmitted signal is always important, since the circuitry in the receiver must be able to extract precise timing information from the incoming signal. Three main purposes of the timing extraction are to allow the signal to be sampled by the receiver at the time the signal-to-noise ratio is a maximum, to maintain the proper pulse spacing, and to indicate the start and end of each timing interval. In addition, since errors resulting from noise and distortion can occur in the signal detection process, it may be desirable for the signal to have an inherent error-detection property. One such signal format that provides these features is the well-known Coded Marked Inversion (CMI) format.

The CMI format is a two-level line code in which each bit of the digital data is converted into a pair of data tokens. An example of a stream of digital data being converted form the Non-Return-to-Zero (NRZ) format to the CMI format is shown in FIG. 1. Specifically, a data bit of "0" is converted into a pair of data tokens "0,1", and a data bit of "1" is converted alternatively into a pair of data tokens "0,0" and "1,1". The pair of data tokens "1,0" is, by definition, an illegal combination. The converted pairs of data tokens, i.e., "0,1", "0,0", or "1,1", is transmitted within the same time frame (period P) in which the digital data is applied to the encoding unit.

CMI is an encoding scheme adopted by SONET STS-3 and SDH STM1 standards, among other standards. CMI encoding guarantees at least one transition per bit, thereby enhancing the clock recovery process at the expense of extra signal bandwidth consumed. Accordingly, all 0s can be regarded as normal CLK frequency, and all 1s can be visualized as half the CLK frequency.

In the prior art, frequency multipliers have been used to double the clock edges for phase comparison. However, it is difficult to implement accurate frequency multipliers at very high bit rates that are common to modern high-speed communication systems. Additional prior art schemes, such as that disclosed in U.S. Pat. No. 5,195,110, implement circuitry that is more complex than desired. Accordingly, it would be advantageous to provide an improved approach that does not require accurate frequency multipliers, and is simpler than schemes found in the prior art.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE ILLUSTRATED EMBODIMENTS

The present invention comprises circuitry and a method that enables timing recovery for a CMI encoded signal. A delay and divide circuit receives an incoming CMI encoded signal and produces a signal that has transitions corresponding to the bit boundaries of the CMI signal. This signal is then passed through a clock recovery loop (i.e., a phase-locked loop) to synchronize a clock signal with the CMI signal. The clock recovery loop further includes a delay circuit that adjusts the timing of the feedback signal such that it matches the delay of the CMI signal that occurs as the signal passes through the delay and divide circuit. Accordingly, the circuit adjusts the timing of the recovered clock signal until it matches the timing of the incoming CMI signal.

Figure 1:
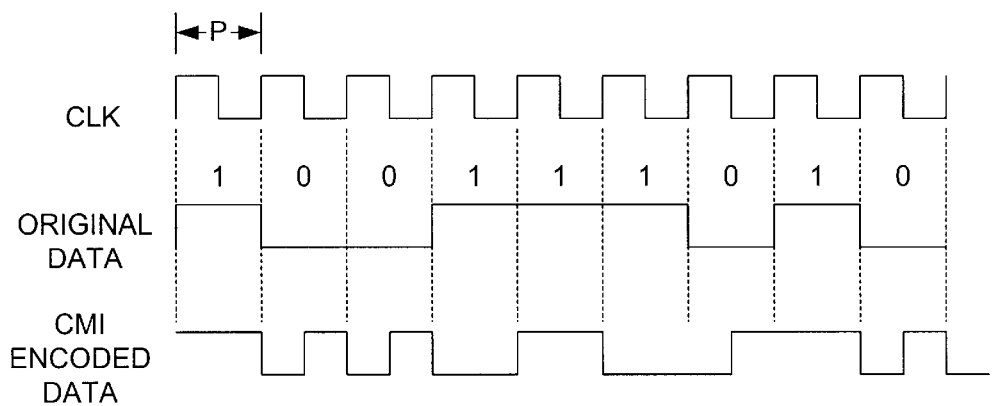
FIG. 1 is a timing diagram illustrating NRZ data being encoded according to the CMI format.
Figure 2:
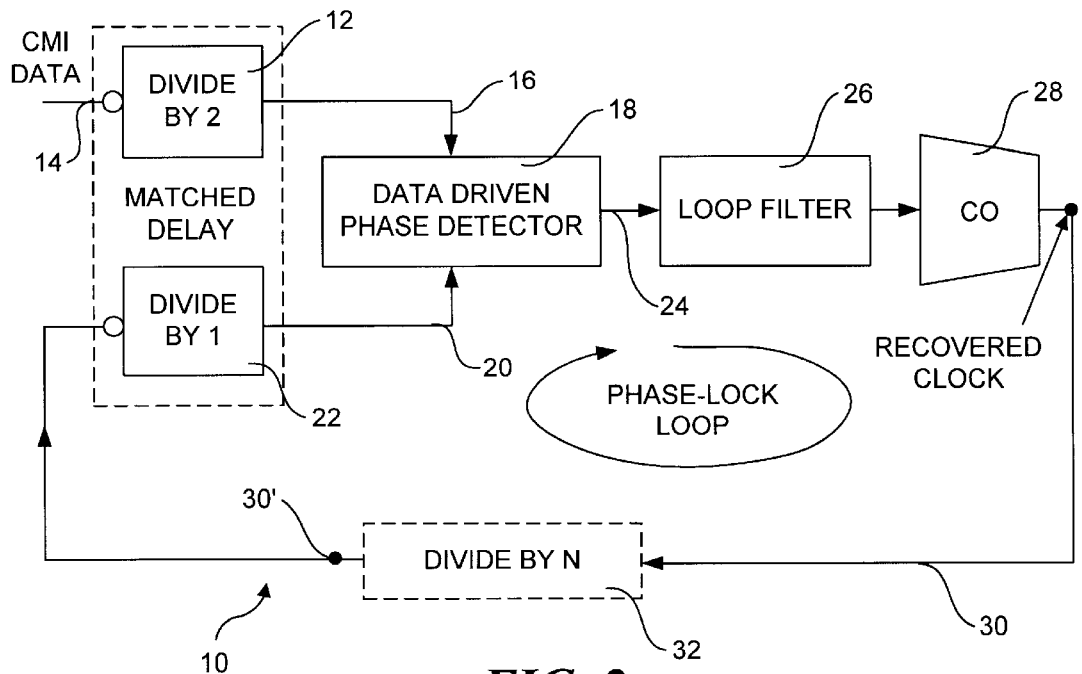
FIG. 2 is a block schematic diagram of an exemplary circuit embodiment of the present invention.

A block diagram of an exemplary circuit 10 in accord with the present invention is shown in FIG. 2. Circuit 10 includes a divide-by-two circuit 12 that receives an inverted CMI data signal 14 comprising a CMI encoded data stream as an input, and provides a first input 16 to a data-driven phase detector 18. As shown in FIG. 1, negative edges of CMI encoded data stream align with the bit boundaries. Via processing the negative edges, the divide-by-two circuit produces an output signal that has transitions corresponding to the bit boundaries of the CMI data stream. This circuit also introduces a delay to the incoming CMI data signal. A second input signal 20 is provided to data-driven phase detector 18 after being conditioned by a divide-by-one circuit 22. Importantly, divide-by-two circuit 12 and divide-by-one circuit 22 provide a pair of input signals to data-driven phase detector 16 that have matched delays. As described in more detail below, by matching the delays, roper clock signal synchronization with the input CMI data can be performed through the use of a timing recovery feedback loop.

Data-driven phase detector 18 produces an output signal 24 that is conditioned by a loop filter 26, and passed into a controlled oscillator (CO) 28. In general, loop filter 26 may comprise any order filter, and typically will comprise an integrating circuit, although other types of filters can be implemented as well. In addition, CO 28 may comprise a voltage-controlled oscillator (VCO), a current-controlled oscillator, or a numerically-controlled oscillator. CO 28 produces a recovered clock signal 30 that is received as an input to divide-by-one circuit 1, which passes signal 20 back to data-driven phase detector 18, thereby forming a phase-locked timing recovery loop. Optionally, a divide-by-N circuit 32 can be applied to recovered clock signal 30, depending on the frequency characteristics of CO 28. For example, some CO's are designed to operate at frequencies that are multiples higher than the CMI clock signal. In these instances, a divide-by-N circuit 32 can be used, wherein N will equal the frequency multiple, and the recovered clock signal would be produced after the divide-by-N circuit at 30.

As will be recognized by those skilled in the art, the data-driven phase detector 18, loop filter 26, and CO 28 comprise a phase-locked loop (PLL). Accordingly, data-driven phase detector 18 produces an output signal that is used to align its two input signals in time through the feedback loop of the PLL, thereby synchronizing the recovered clock signal with the timing of the CMI data signal. It is noted that the two signals that are input to data-driven phase detector 18 have altered timing (i.e., have delays) that are introduced by divide-by-two circuit 12 and divide-by-one circuit 22. Accordingly, divide-by-one circuit 22 is designed so that it introduces a delay on recovered clock signal 30 that matches the delay introduced on CMI data signal 14 by divide-by-two circuit 12.

Figure 3:
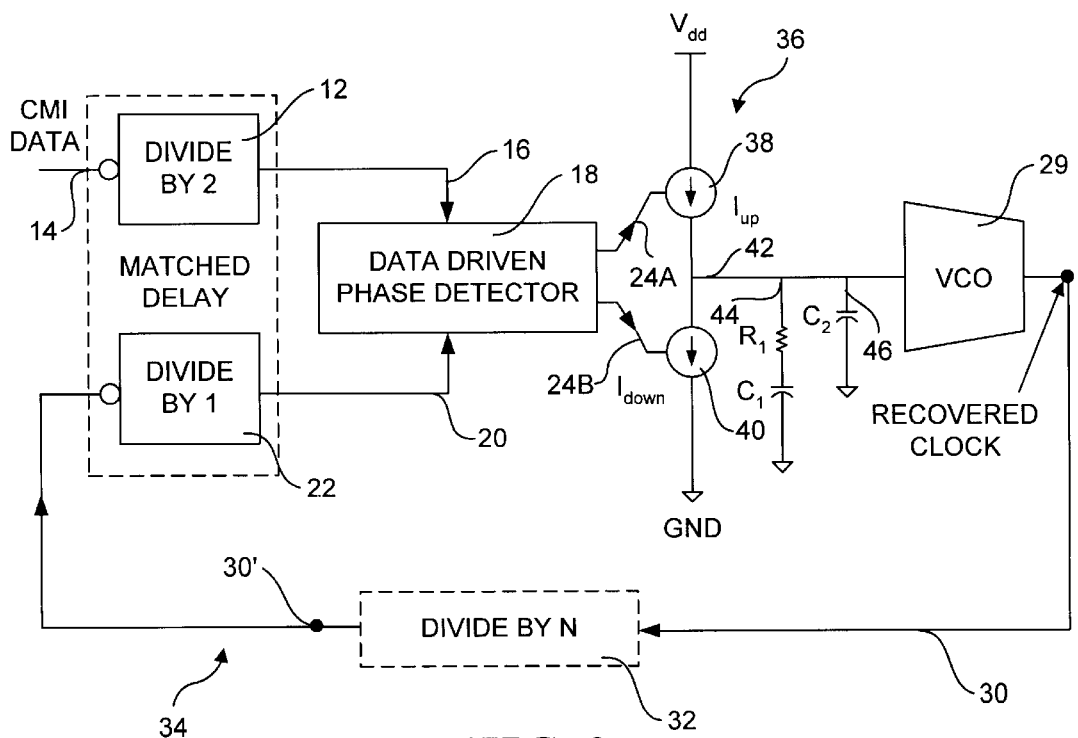
FIG. 3 is a block schematic diagram of the exemplary circuit of FIG. 2 in which a charge-pump is implemented.

With reference to FIG. 3, an exemplary circuit 34 is depicted in which the loop filter comprises a charge pump 36 coupled to several filter elements, including a resistor $R_1$ and capacitors $C_1$ and $C_2$. In this configuration, data-driven phase detector 18 produces a pair of logic-level output signals, including an "UP" signal 24A, and a "DOWN" signal 24B. The logic level on up signal 24A is high when data-driven phase detector 18 outputs an "UP" pulse. Similarly, the logic level on signal 24B is high when data-driven phase detector 18 outputs a "DOWN" pulse. As described below in further detail, in general there is usually no instant in which the logic level is high on both signals 24A and 24B, while there will be instants in which the logic level is low on both signals.

Signals 24A and 24B are fed into respective controlled current sources 38 and 40, wherein one side of controlled current source 38 is tied to Vdd, and one side of controlled current source 40 is tied to ground, while the other sides of the controlled current sources are commonly tied to a line 42. Line 42 is coupled to ground along a first filter line 44 that includes resistor $R_1$ and capacitor $C_1$ connected in series, and a second filter line 46 comprising capacitor $C_2$. Collectively, charge pump 36 and the filter elements produce a filtered signal based on signal inputs on 24A and 24B that is received as an input to a VCO 29.

Figure 4:
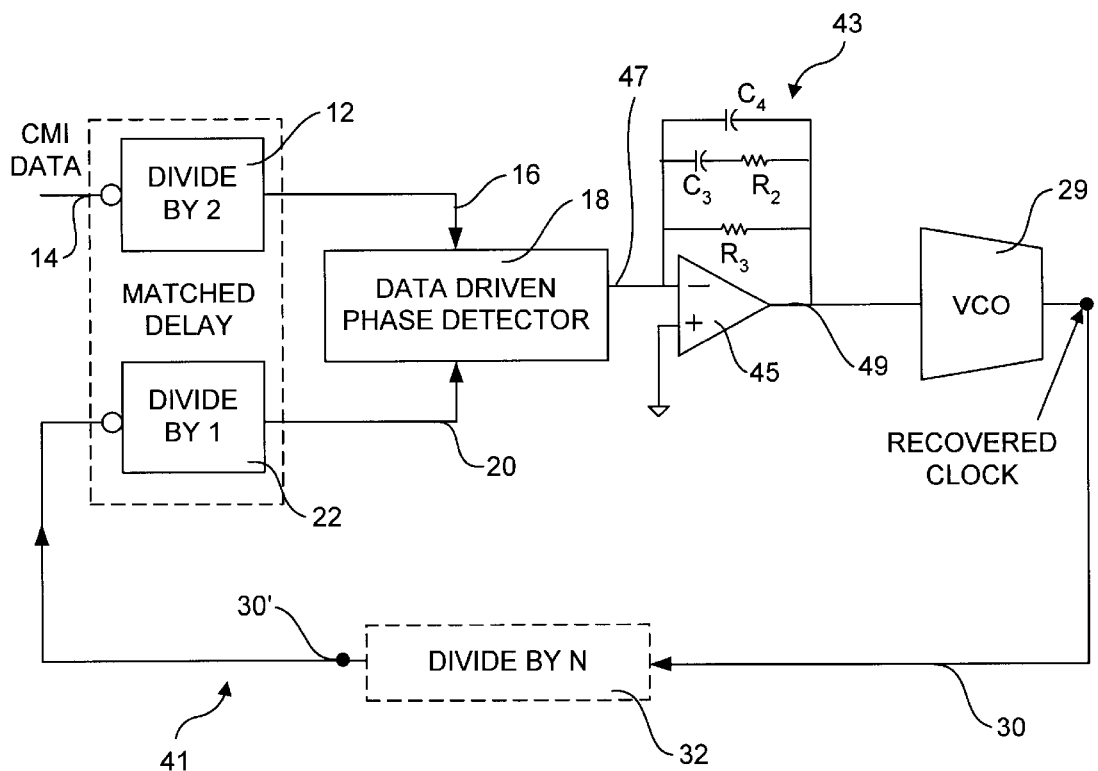
FIG. 4 is a block schematic diagram of another exemplary circuit in accord with the present invention in which an integrating circuit is implemented.

Another exemplary circuit 41 that may be implemented in the present invention is shown in FIG. 4. In this circuit, an integrating circuit 43 that includes an op amp 45, resistors $R_2$ and $R_3$ and capacitors $C_3$ and $C_4$ performs the loop filter function. An output signal 47 from data-driven phase detector 18 is received at the inverting terminal of op amp 45, while the non-inverting terminal of the op amp is tied to ground. Resistor $R_3$ is selected to adjust the gain of the circuit, so as to produce an output signal 49 that is suitable for driving VCO 29.

Figure 5:
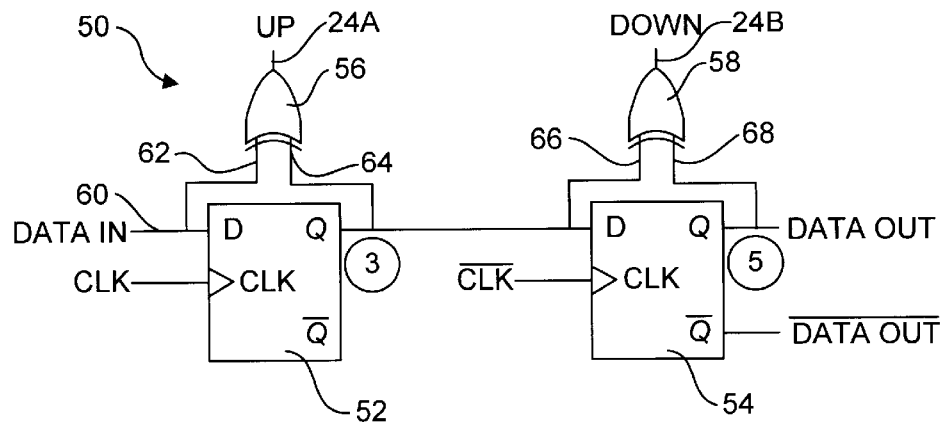
FIG. 5 is a circuit diagram of an exemplary circuit that can be used as the data-driven phase detector of the FIG. 2 and FIG. 3 embodiments.

An exemplary circuit 50 for data-driven phase detector 18 is shown in FIG. 5. Circuit 50 comprises a pair of D-type flip-flops 52 and 54 that are respectively coupled to a pair of XOR gates 56 and 58. Data in 60 is received at the "D" input of flip-flop 52, and is also received at an input 62 of XOR gate 56. The other input (64) of XOR gate 56 is tied to the "Q" output of flip-flop 52. The "Q" output of flip-flop 52 is also received as the "D" input of flip-flop 54, and is also received as an input 66 to XOR gate 58. The "Q" output of flip-flop 54 is tied to the other input (68) of XOR gate 58. Flip-flop 52 receives a normal CLK signal at its clock input, while flip-flop 54 receives an inverted CLK signal at its clock input.

Figure 6:
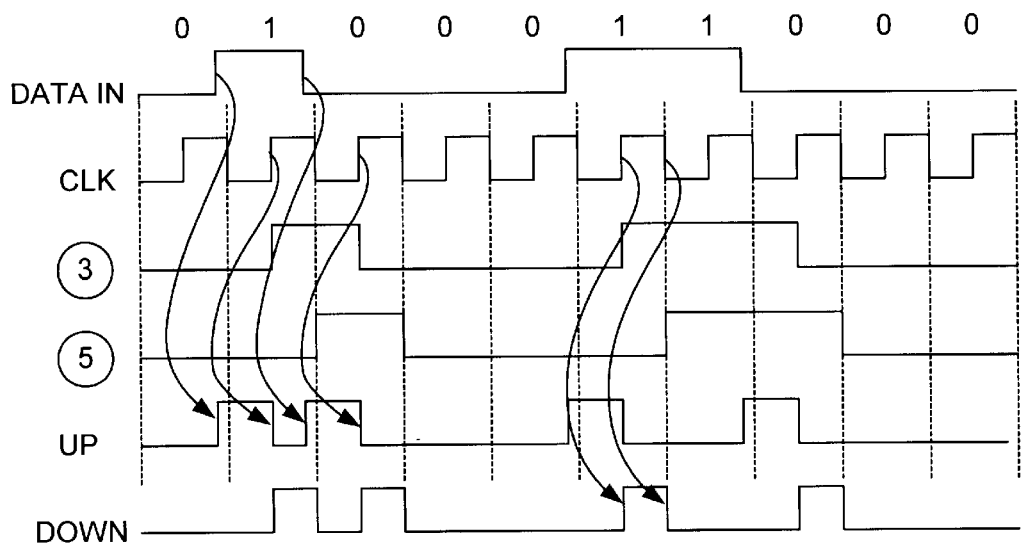
FIG. 6 is a timing diagram corresponding to the data-driven phase detector circuit of FIG. 5.

A timing diagram for circuit 50 is shown in FIG. 6. It will be understood by those skilled in the art that the timing diagram of FIG. 6 and other timing diagrams discussed below illustrate idealized circuit behaviors that do not include signal propagation delays, which will be present in real devices. These timing diagrams are presented in this matter herein for clarity. In synchrony with each change (i.e. a rising or falling edge) of the "DATA IN" in signal, a high logic-level pulse occurs on the "UP" output that is wider or narrower than one-half of the clock period depending on the phase relationship between the CMI data and the clock signal. Additionally, a high logic-level pulse for one-half of the clock period occurs on the "DOWN" output, wherein the pulse is delayed (relative to the "UP" output pulse) by one-half of the clock period.

In combination with circuit 50, charge pump 36 works in the following manner: When data-driven phase detector 18 outputs an up pulse, signal 24A is high and signal 24B is low, causing controlled current source 38 to provide a controlled current that causes charge to build in capacitors $C_1$ and $C_2$ at a controlled rate. In contrast, when data-driven phase detector 18 outputs a down pulse, signal 24A is low and signal 24B goes high, causing controlled current source 40 to discharge capacitors $C_1$ and $C_2$ at a controlled rate. In this manner, the voltage that is fed into VCO 28 is controlled such that the timing of the oscillation produced by VCO 29 matches the clocking of CMI data signal 14, thereby producing a recovered CMI clock signal.

Figure 7:
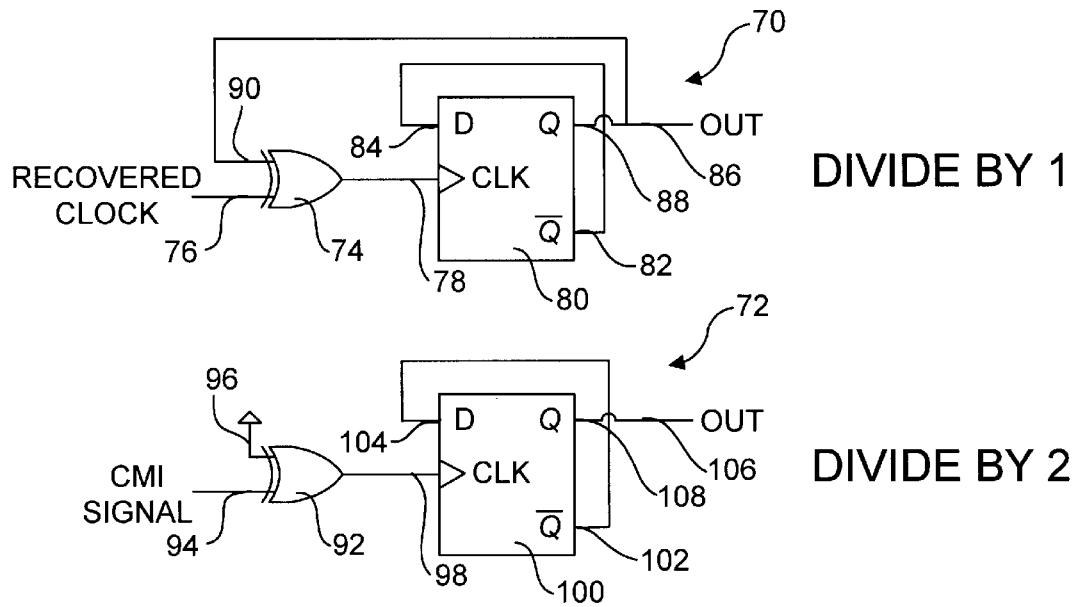
FIG. 7 shows exemplary circuit diagrams in accord with a divide-by-one and a divide-by-two circuit using a technology independent implementation.

A first set of exemplary circuits 70 and 72 that respectively perform the divide-by-one and divide-by-two functions under a technology-independent implementation is shown in FIG. 7. Circuit 70 comprises an XOR gate 74 that receives recovered clock signal 30 at an input 76. The output of XOR gate 74 is fed into the "CLK" input 78 of a D-type flip-flop 80. The "Q-bar" output 82 of flip-flop 80 is fed back into the "D" input 84, while an output signal 86 is produced at the "Q" output 88 of the flip-flop. In addition, output signal 82 comprises the other input (90) of XOR gate 74.

Circuit 72 is substantially similar to circuit 70, except that in circuit 72 the other input of the XOR gate is maintained at a high logic level. Accordingly, circuit 72 comprises an XOR gate 92 that receives CMI data 14 on an "IN" input 94, while the other input (96) is tied to a high logic level signal. The output of XOR gate 92 is fed into the "CLK" input 98 of a D-type flip-flop 100. The "Q-bar" output 102 of flip-flop 100 is fed back into the flip-flop at the "D" input 104, while an output signal 106 is produced at the "Q" output 108 of the flip-flop.

Figure 8:
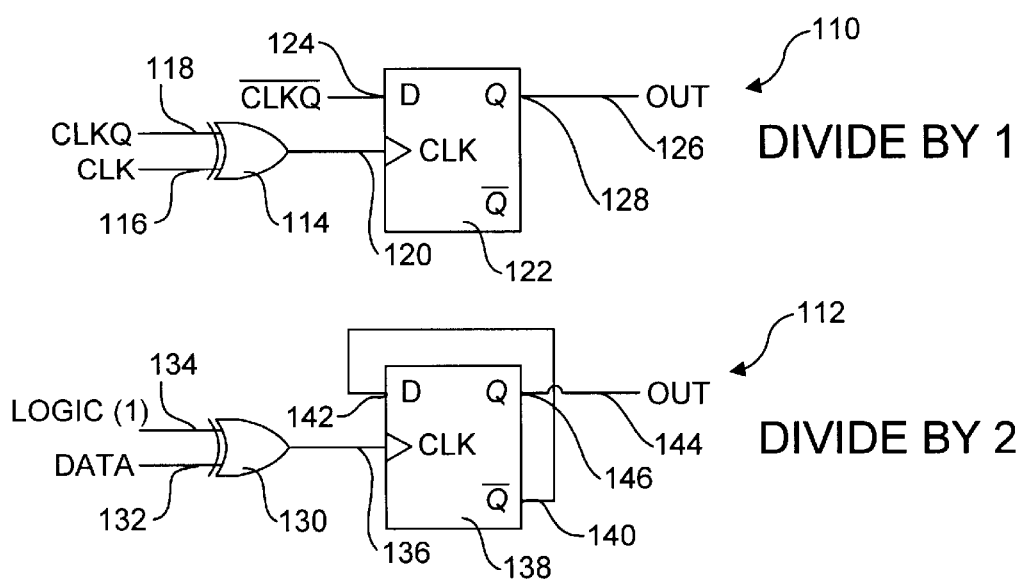
FIG. 8 shows exemplary circuit diagrams in accord with a first set of divide-by-one and divide-by-two circuit embodiments using a CML implementation.

FIG. 8 shows a first set of an exemplary divide-by-one circuit 110 and divide-by-two circuit 112 implemented using a current-mode logic (CML) implementation. Circuit 110 comprises an XOR gate 114 that receives a "CLK" signal in accord with recovered clock signal 30 on an input 116 and a "CLKQ" signal on an input 118. It is noted that "CLKQ" signal comprises a clock signal that is out of phase by a quarter cycle, i.e., out of phase by a quadrature, with the "CLK" signal, hence the "Q" in the signal name. The output of XOR gate 114 is received as an input to the "CLK" input 120 of a D-type flip-flop 122. A "CLKQ-bar" (i.e., an inverted "CLKQ" signal) is received at the D input 124 of flip-flop 122, while an output signal 126 in accord with signal 20 is output at the "Q" output 128 of the flip-flop.

Circuit 112 comprises an XOR gate 130 that receives CMI data 14 on a "DATA" input 132, while the other input (134) is tied to a high logic level (i.e., logic 1). The output of XOR gate 130 is received as an input to the "CLK" input 136 of a D-type flip-flop 138. The "Q-bar" output 140 of flip-flop 138 is fed back into flip-flop at the "D" input 142, while an output signal 144 is produced at the "Q" output 146 of the flip-flop.

Figure 9:
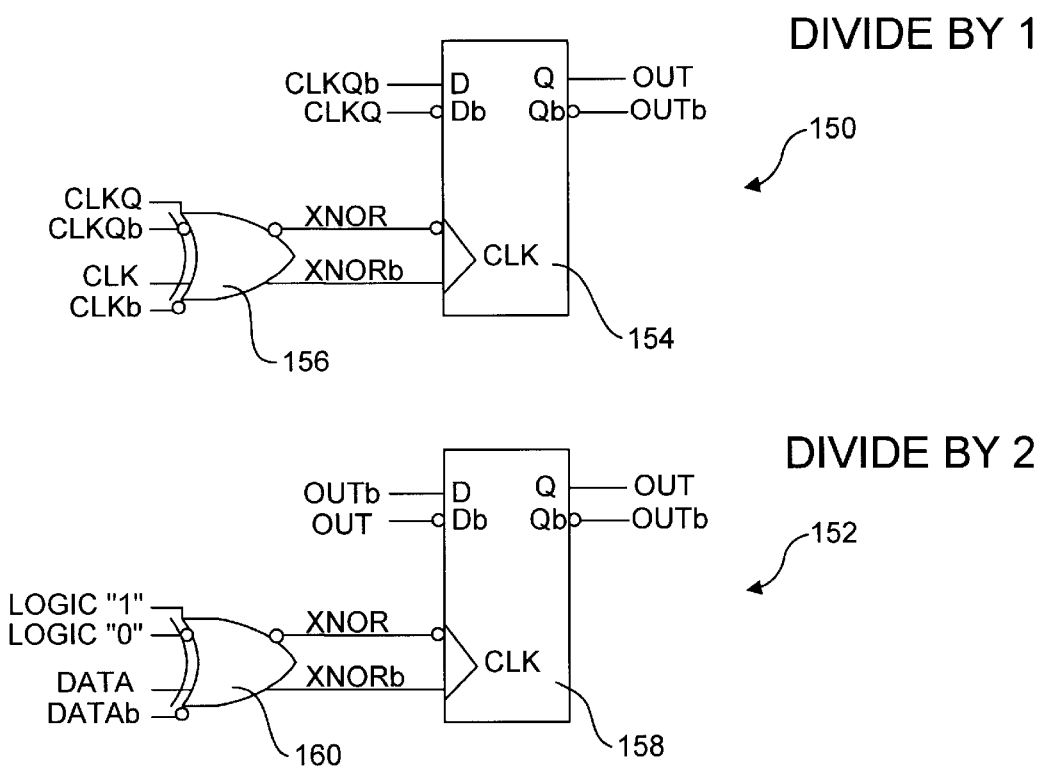
FIG. 9 shows exemplary differential circuit diagrams in accord with a second set of divide-by-one and divide-by-two circuit embodiments using a CML implementation.

Another set of exemplary embodiments of a divide-by-one circuit 150 and a divide-by-two circuit 152 suitable for a CML implementation are shown in FIG. 9. Note in the Figures that the "b" at the end of a signal label in each of circuits 150 and 152 indicates that the signal is the compliment (i.e., inverted) of a corresponding like-labeled signal. Divide-by-one circuit 150 comprises a negative edge triggered D-type flip-flop 154 including a clocking input "CLK" that receives a pair of complimented inputs "XNOR" and "XNORb" from a quad-input XNOR gate 156, inputs "D" and "Db," and outputs "Q," and "Qb." The inputs to quad-input XNOR gate 156 include a clock quadrature signal "CLKQ," a complimented clock quadrature signal "CLKQb," a clock signal "CLK," and a complimented clock signal "CLKb." As before, the "CLK" input signal corresponds to recovered clock signal 30, and the "CLKQ" signal lags the "CLK" signal by a quarter phase. "CLKb" and "CLKQb" are simply compliments of their corresponding like-labeled signals. In response to complimented inputs "XNOR" and "XNORb," input "CLKQb" at input "D," and input CLKQ at input "Db," negative edge triggered D-flip-flop 158 produces a normal output "OUT" at output "Q," and a complimented output "OUTb" at output Similarly, divide-by-two circuit 152 also comprises a negative edge triggered D-type flip-flop 158 including a clocking input "CLK" that receives a pair of complimented inputs "XNOR" and "XNORb" from a quad-input XNOR gate 160, complimented inputs "D" and "Db," and complimented outputs "Q," and "Qb." The inputs to quad-input XNOR gate 160 include a logic "1" input, a logic "0" input, a data input corresponding to CMI signal data 14, and a complimented data input labeled "DATAb." Divide-by-two circuit 152 a normal output at output "0" and a complimented output at output "Qb."

Figure 10:
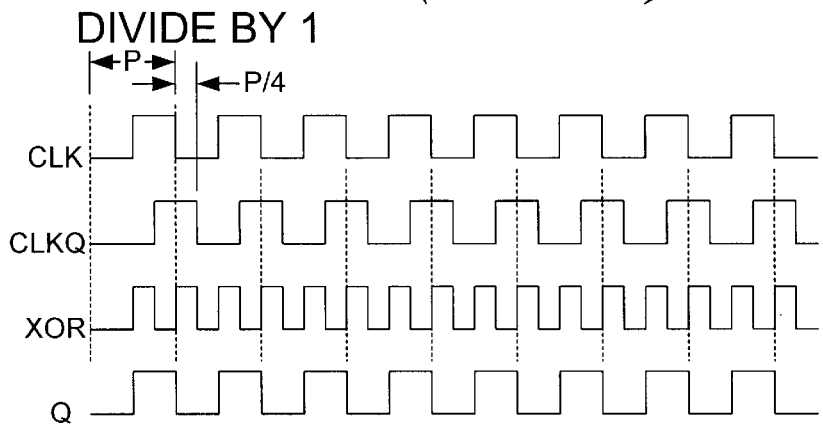
FIG. 10 is a timing diagram in accord with the CML divide-by-one circuit of FIGS. 8 and 9.
Figure 11:
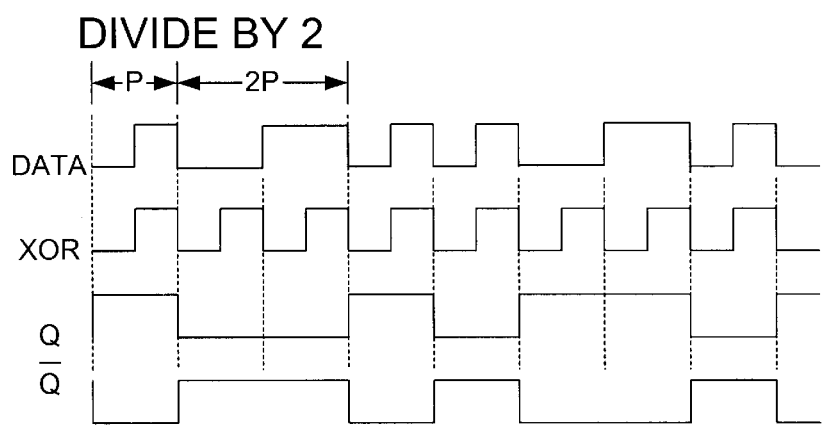
FIG. 11 is a timing diagram in accord with the CML divide-by two circuit of FIG. 8 and 9.

A timing diagram for divide-by-one circuits 110 and 150 is shown in FIG. 10, while a timing diagram for divide-by-two circuits 112 and 152 is shown in FIG. 11. As depicted in the FIGS., the "Q" output of divide-by-one circuits 100 and 150 has the same period as the "CLK" input (i.e., recovered clock signal 30), while the "Q" output of divide-by-two circuits 112 and 152 has a period equal to twice the period of the "DATA" input signal (i.e., the CMI signal input signal).

Figure 12:
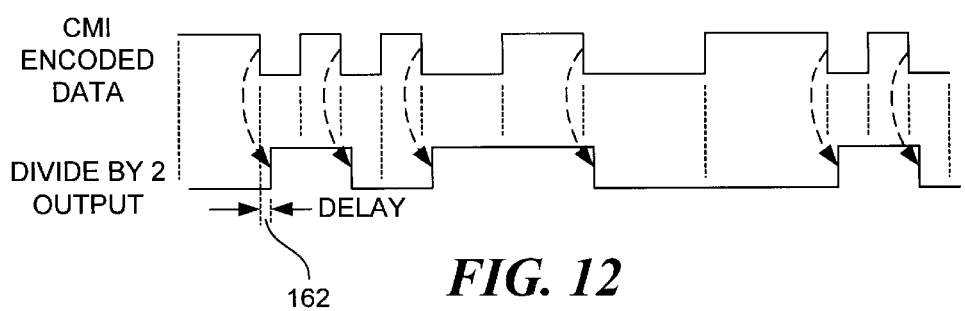
FIG. 12 is a timing diagram illustrating the response of the divide-by-two circuit in response to an exemplary CMI data signal.

A timing diagram showing the output of divide-by-two circuits 112 and 152 in response to an exemplary CMI data signal is shown in FIG. 12. Note that the divide-by-two circuits' output changes logic level every time a falling edge of the CMI data signal is detected. As a result, the signal produced by the divide-by-two circuits comprise transitions that only occur at the bit boundaries of the CMI data signal. Also, by only having signal transitions occurring at the falling edges of the CMI data signal, a delay 160 applied to the CMI data signal is consistent, and can be matched more easily so that the same delay can be applied to recovered clock signal 30 by divide-by-one circuit 22.

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. Accordingly, it is not intended that the scope of the invention in any way be limited by the above description, but instead be determined entirely by reference to the claims that follow.

What is claimed is:

1. An apparatus comprising:
    a first signal-conditioning circuit having an input to receive a Coded Mark Inversion (CMI) signal and having an output, said first signal-conditioning circuit to produce a first delayed signal having a first delay;
    a timing recovery loop circuit having a first input connected to the output of the first signal-conditioning and a second input and an output, said timing recovery loop to produce a loop reference signal comprising a recovered clock signal having a frequency in accord with a clocking of the CMI signal; and
    a second signal-conditioning circuit to cause a delay to the loop reference signal to generate a second delay signal that has a second delay that matches the first delay of the first delayed signal, comprising a divide-by-one circuit including:
        an XOR gate having a first input to receive the recovered clock signal, a second input, and an output; and
        a D-type flip-flop having a CLK input connected to the output of the XOR gate, a D input and Q and Qbar outputs, said Qbar output connected to said D input, said Q output connected to the second input of the XOR gate, said divide-by-one circuit having an output at said Q output connected to the second input of the timing recovery loop circuit.

2. The apparatus of claim 1, wherein the timing recovery loop comprises a phase-locked loop including:
    a phase detection circuit having a first input connected to the output of the first conditioning circuit and a second input connected to the output of the second conditioning circuit and at least one output, said phase detection circuit to produce a phase adjustment signal to align a timing of the first delayed signal and the second delayed signal
    a loop filter circuit having an input connected to said at least one output of the phase detection circuit and an output; and
    a controlled oscillator, having an input connected to the output of the loop filter, and to produce an output signal corresponding to the loop reference signal.

3. The apparatus of claim 2, wherein the phase detection circuit comprises a data-driven phase detector having a first and second output, said data-driven phase detector to produce respective logic-level signals on said first and second outputs so as to adjust a timing of the loop reference signal.

4. The apparatus of claim 2, wherein the controlled oscillator comprises a voltage-controlled oscillator.

5. The apparatus of claim 2, further comprising a frequency divider having an input and an output, said input connected to the output of the controlled oscillator.

6. The apparatus of claim 2, wherein the loop filter circuit comprises a charge pump.

7. The apparatus of claim 6, wherein the charge pump comprises:
a first current source having a control input connected to a first output of the phase detection circuit;
a second current source having a control input connected to the second output of the phase detection circuit; and
at least one charge storage element connected to each of the first and second current sources that is charged when the first current source is activated and discharged when the second current source is activated.

8. The apparatus of claim 2, wherein the loop filter comprises an integrating circuit.

9. The apparatus of claim 1, wherein the first conditioning circuit comprises a divide-by-two circuit including:
an XOR gate having a first input for receiving the CMI signal and second input tied to a high logic-level and an output; and
a D-type flip flop having a CLK input connected to the output of the XOR gate, a D input, and Q and Qbar outputs, said Qbar output connected to said D input, said output connected to said Q output.

10. The apparatus of claim 1, wherein the first conditioning circuit comprises a divide-by-two circuit including:
a quad-input XNOR gate including a first input for receiving the CMI data signal and a second input for receiving a high logic signal and a pair of complimented outputs; and
a negative edge triggered D-type flip flop having a CLK input for receiving the complimented outputs of the quad-input XNOR gate, a D input and Q and Qbar outputs, said divide-by-two circuit output corresponding to said Q output.

11. The apparatus of claim 1, wherein the CMI signal comprises a plurality of bit boundaries and the first delayed signal comprises a plurality of logic transitions that occur in response to detection of respective bit boundaries of the CMI signal.

12. An apparatus comprising:
a first signal-conditioning circuit having an input to receive a Coded Mark Inversion (CMI) signal and having an output, said first signal-conditioning circuit to produce a first delayed signal having a first delay;
a timing recovery loop circuit having a first input connected to the output of the first signal-conditioning and a second input and an output, said timing recovery loon to produce a loop reference signal comprising a recovered clock signal having a frequency in accord with a clocking of the CMI signal; and
a second signal-conditioning circuit to cause a delay to the loon reference signal to generate a second delay signal that has a second delay that matches the first delay of the first delayed signal, comprising a divide-by-one circuit including:
an XOR gate having a first input to receive the recovered clock signal and a second input to receive a clock quadrature signal and an output, said clock quadrature signal being delayed relative to said recovered clock signal by one-fourth of the period of the recovered clock signal; and
a D-type flip flop having a CLK input connected to the output of the XOR gate, a D input, and Q and Qbar outputs, said D input to receive an inverted recovered clock signal, said divide-by-one circuit output corresponding to said Q output connected to the second input of the timing recovery loop circuit.

13. An apparatus comprising:
first signal-conditioning circuit having an input to receive a Coded Mark Inversion (CMI) signal and having an output, said first signal-conditioning circuit to produce a first delayed signal having a first delay;
a timing recovery loop circuit having a first input connected to the output of the first signal-conditioning and a second input and an output, said timing recovery loop to produce a loop reference signal comprising a recovered clock signal having a frequency in accord with a clocking of the CMI signal; and
a second signal-conditioning circuit to cause a delay to the loop reference signal to generate a second delay signal that has a second delay that matches the first delay of the first delayed signal, comprising a divide-by-one circuit including:
a quad-input XNOR gate including a first input to receive the recovered clock signal and a second input to receive a clock quadrature signal and a pair of complimented outputs, said clock quadrature signal being delayed relative to said recovered clock signal by one-fourth of the period of the recovered clock signal; and
a negative edge triggered D-type flip flop having a CLK input to receive the complimented outputs of the quad-input XNOR gate, and D inputs and Q and Qbar outputs, said D input to receive an inverted recovered clock signal, said divide-by-one circuit output corresponding to said Q output.

14. An apparatus comprising:
a first signal-conditioning circuit having an input for receiving a Coded Mark Inversion (CMI) signal and having an output, said first signal-conditioning circuit to produce a first delayed signal having a first delay;
a phase-locked loop circuit including:
a phase detection circuit having a first input connected to the output of the first conditioning circuit and a second input connected to the output of the second conditioning circuit and at least one output, said phase detection circuit to produce a phase adjustment signal to align a timing of the first delayed signal and the second delayed signal
a loop filter comprising an integration circuit having an input connected to said at least one output of the phase detection circuit and an output; and
a controlled oscillator, having an input connected to the output of the integration circuit, and to produce a loop reference signal comprising a recovered clock signal having a frequency in accord with a clocking of the CMI signal; and
a second signal-conditioning circuit to cause a delay to the loop reference signal to generate a second delay signal that has a second delay that matches the first delay of the first delayed signal, said second-siqnal-conditioning circuit comprising a divide-by-one circuit including:
an XOR gate having a first Input to receive the recovered clock signal, a second input, and an output; and
a D-tvpe flip-flop having a CLK Input connected to the output of the XOR gate, a D input and Q and Qbar outputs, said Qbar output connected to said D input, said Q output connected to the second input of the XOR gate, said divide-by-one circuit having an output at said Q output connected to the second input of the timing recovery loot circuit.

15. The apparatus of claim 14, wherein the phase detection circuit comprises a data-driven phase detector having a first and second output, said data-driven phase detector to produce respective logic-level signals on said first and second outputs so as to adjust a timing of the loop reference signal.

16. The apparatus of claim 14, further comprising a frequency divider having an input and an output, said input connected to the output of the controlled oscillator.

17. The apparatus of claim 14, wherein the integration circuit comprises a charge pump including:
   a first current source having a control input connected to a first output of the phase detection circuit;
   a second current source having a control input connected to a second output of the phase detection circuit; and
   at least one charge storage element connected to each of the first and second current sources that is charged when the first current source is activated and discharged when the second current source is activated.

18. The apparatus of claim 14, wherein the first signal conditioning circuit comprises a divide-by-two circuit.

19. A method for recovering a clock signal from a Coded Marked Inversion (CMI) signal, comprising:
   causing a delay to the CMI signal to produce a first delayed signal having a first delay relative to a timing of the CMI signal;
   inputting the first delayed signal and a second delayed signal through a timing recovery loop to produce a recovered clock signal; and
   causing a delay to the recovered clock signal to produce the second delayed signal, said second delayed signal having a second delay relative to a timing of the recovered clock signal and being produced by:
      receiving the recovered clock signal at a first input of an XOR gate;
      clocking a D-type flip flop with an output of the XOR gate at a CLK input of the D-type flip-flop, said D-type flip-flop having a D input and Q and Qbar outputs, said Qbar output connected to said D input, said Q output connected to a second input of the XOR gate; and
      producing the second delayed signal at the Q output of the D flip-flop,
   wherein the first and second delayed signals have matched delays relative to their respective input signals.

20. The method of claim 19, wherein the first and second delayed signals each have a phase and wherein producing the recovered clock signal with the timing recovery loop comprises:
   comparing the phase of the first delayed signal to the phase of the second delayed signal to produce a phase detection signal;
   filtering the phase detection signal to produce a filtered phase detection signal; and
   generating a controlled oscillation in response to the filtered phase detection signal to produce the recovered clock signal.

21. The method of claim 20, wherein the timing recovery loop comprises a phase-locked loop circuit that includes a controlled oscillator that produces a clock recovery signal having a frequency based on an amplitude of the filtered phase detection signal.

22. The method of claim 20, wherein the timing recovery loop comprises a phase-locked loop circuit that includes a controlled oscillator that produces an output signal having a frequency based on an amplitude of the filtered phase detection signal, further comprising dividing the frequency of the output signal to produce the recovered clock signal.

23. The method of claim 20, wherein the phase detection signal is filtered by an integrating circuit.

24. The method of claim 23, wherein the integrating circuit comprises a charge pump.

* * * * *

UNITED STATES PATENT AND TRADEMARK OFFICE
CERTIFICATE OF CORRECTION

PATENT NO.    : 6,748,027 B1
DATED         : June 8, 2004
INVENTOR(S)   : Kocaman et al.

It is certified that error appears in the above-identified patent and that said Letters Patent is hereby corrected as shown below:

Column 7,
Lines 46 and 51, delete "loon" and insert -- loop --.

Column 8,
Line 59, delete "loon" and insert -- loop --.

Signed and Sealed this

Twenty-first Day of September, 2004

JON W. DUDAS
*Director of the United States Patent and Trademark Office*